United States Patent [19]

Bakos et al.

[11] 4,048,356

[45] Sept. 13, 1977

[54] HERMETIC TOPSEALANT COATING AND PROCESS FOR ITS FORMATION

[75] Inventors: Peter Bakos, Endicott; Irving Memis, Vestal; John Rasile, Endicott, all of N.Y.

[73] Assignee: International Business Machines Corporation, Armonk, N.Y.

[21] Appl. No.: 640,511

[22] Filed: Dec. 15, 1975

[51] Int. Cl.$^2$ .................... B05D 3/02; B05D 7/26
[52] U.S. Cl. .................... 427/379; 204/159.13; 204/159.22; 260/2 S; 260/824 R; 260/824 EP; 260/825; 260/826; 260/827; 260/30.8 R; 260/31.8 XA; 260/32.4; 260/32.6 R; 260/33.2 EP; 260/33.4 EP; 260/33.6 PQ; 260/33.6 SB; 427/387; 427/388 R; 428/412; 428/418; 428/447; 428/450; 428/457; 428/458; 428/460; 428/461; 428/462; 428/463; 428/901; 526/11.1; 526/11.2; 526/279
[58] Field of Search ............ 428/447, 457, 901, 458, 428/429, 450, 460, 418, 462, 463, 412, 461; 526/279, 11.1, 11.2; 260/827, 824 R, 2 S, 824 EP, 825, 826, 30.8 R, 31.8 XA, 32.4, 32.6 R, 33.2 EP, 33.4 EP, 33.6 PQ, 33.6 NR; 427/387, 388 R, 379; 204/159.13, 159.22

[56] References Cited

U.S. PATENT DOCUMENTS

| | | | |
|---|---|---|---|
| 3,085,908 | 4/1963 | Morehouse | 428/450 |
| 3,200,031 | 8/1965 | Rittenhouse | 428/450 |
| 3,203,919 | 8/1965 | Brachman | 526/279 |
| 3,305,504 | 2/1967 | Huntington | 428/450 |
| 3,398,045 | 8/1968 | Clayton | 428/447 |
| 3,620,895 | 11/1971 | Bailey | 428/447 |
| 3,632,440 | 1/1972 | Preston | 428/447 |
| 3,644,166 | 2/1972 | Gause | 428/447 |
| 3,667,993 | 6/1972 | Stevenson | 428/447 |
| 3,804,919 | 4/1974 | Schrage | 428/447 |
| 3,928,683 | 12/1975 | Chandross | 428/447 |

*Primary Examiner*—Ellis Robinson
*Attorney, Agent, or Firm*—David M. Bunnel

[57] ABSTRACT

A hermetic topsealant for metal electrodes on components and other microelectronic circuitry is formed by polymerizing a mixture of an unsaturated silane monomer, a bifunctional silane adhesion promoter, a polymeric plasticizer and a stabilizer.

The purpose of this abstract is to enable the public and the Patent Office to rapidly determine the subject matter of the technical disclosure of the application. This abstract is neither intended to define the invention of the application nor is it intended to be limiting as to the scope thereof.

13 Claims, No Drawings

HERMETIC TOPSEALANT COATING AND PROCESS FOR ITS FORMATION

BACKGROUND OF THE INVENTION

This invention relates generally to silane sealing compositions and more particularly to heremetic topsealant coatings for integrated circuits formed by polymerizing unsaturated silanes in the presence of a silane adhesion promoter and a polymeric plasticizer.

It is customary to seal the metal circuitry and connections on components and other microelectronic structures in order to protect them from the environment. The components are coated with a liquid material which is heated to cure the material and form the protective layer. Various materials have been used for this purpose in the past, including those containing silicon. In order to be effective in protecting the circuitry from corrosion and metal migration, the coating should be free of voids and cracks, should penetrate between the integrated circuit chips and the substrate, should be resistant to extremes of temperature, should be an adequate dielectric insulator between conductor lines, and should firmly adhere to the various metal, resin, oxide, glass, nitride, etc., surfaces with which it is in contact.

We have discovered a new, hermetic coating formation process and coating which provides good protection for metal circuitry against corrosion and metal migration.

BRIEF SUMMARY OF THE INVENTION

In accordance with this invention, there is provided a process for sealing electronic circuitry comprising:
applying to said circuitry a layer which includes;
a vinyl unsaturated silane monomer,
a bifunctional silane adhesion promoter,
a polymeric plasticizer
an organic solvent, and
curing the layer to form a cross-linked polysilane coating on said circuitry.

A composition is provided which includes:
a vinyl unsaturated silane based monomer, such as paramethyldisiloxane methylmethacrylate, and
a bifunctional silane based adhesion promoter, such as beta-(3,4-epoxycyclohexyl)ethyltrimethoxy silane,
a polymeric plasticizer, and
an organic solvent.

A hermetic topsealant coating is provided by drying and curing the composition to form a polymerized cross-linked, polysilane coating layer.

DETAILED DESCRIPTION

In the process of the invention, a layer of material is coated from an organic solvent onto the circuit structure which is to be protected, such as a ceramic substrate having metal conductor lines with integrated circuit chips electrically bonded thereto. The material is then polymerized or cured to form a continuous, adherent, hermetic topsealant coating layer. The material is applied by any convenient technique, such as spin, spray, dip or dispense coating. The coating is cured either by heating to polymerize the coating to a solid film, by exposing it to actinic radiation, or by a combination of heating and irradiation.

The coating material includes an organo-silicon monomer which contains a vinyl unsaturated group. Examples of such monomers are pentamethyldisiloxane methylmethacrylate, $CH_2=C(CH_3)COOH_2Si(CH_3)_2OSi(CH_3)_3$; vinyltrichlorosilane, $C_2H_3SiCl_3$; vinyltriethoxysilane, $C_2H_3Si(OC_2H_5)_3$; and vinyl-tris(2-methoxyethoxy)silane, $C_2H_3Si(OC_2H_4OCH_3)_3$.

When such monomers are applied by themselves to a circuit structure, and the monomers polymerized, a coating results which contains cracks, voids, and has poor adhesion to the surface. Accordingly, the invention employs an additional siloxane monomeric adhesion promoter and a polymeric plasticizer.

Suitable adhesion promoters are silanes which are bifunctional. The dual functionality of the compounds permits the building of a chemical bridge between the organic and inorganic materials. This acts to hold the coating to the substrate. Examples of such adhesion promoters are gamma-aminopropyltriethoxysilane, $NH_2(CH_2)_3Si(OC_2H_5)_3$; beta-(3,4-epoxycyclohexyl)ethyltrimethoxysilane,

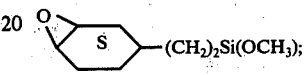

gamma-glycidoxypropyltrimethoxysilane,

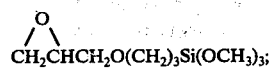

and N-beta(aminoethyl)-gamma-aminopropyl-trimethoxysilane, $NH_2(CH_2)_2NH(CH_2)_3Si(OCH_3)_3$.

Both the silane monomers and adhesion promoters are from a class of compounds known as organo-functional silanes which are commercially available.

Low molecular weight organic polymeric plasticizers are added in order to provide a non-brittle, void and crack-free coating layer. Examples of suitable plasticizers include: epoxy resins, polyesters, polycarbonates, polychloroprene, polystyrene, alkyd resins, allyl resins, amino resins, polysulfone resins, vinyl polymers and copolymers, urea and melamine resins, and amide/imide polymers. The polymeric plasticizers act to provide flexible coatings while preserving their hemeticity. The plasticizer in some cases can also be added in the form of a monomer, which will polymerize upon curing the coating and the term "polymeric plasticizer" is intended to include this feature.

In order to provide for improved shelf life, a stabilizer can be employed. Examples of suitable stabilizers are dimethylacetamide, N,N-dimethylaniline, piperidine, 4,4'-dimethoxy-diphenylamine, and phenyl-alpha-naphthylamine.

If desired, the curing time can be reduced and the required degree of polymerization assured by employing an accelerator. Examples of suitable accelerators are aldehydes; such as benzenecarboxaldehyde, cinnamaldehyde, 2-furancarboxaldehyde; anhydrides, such as maleic anhydride, n-valeric anhydride, phthalic anhydride, and hexahydrophthalic anhydride; and vinyl monomers, such as styrene and methylmethacrylate.

The solvent is selected so as to dissolve the components of the coating material. Examples of suitable volatile organic solvents include ketones; such as cyclohexanone, cyclopentanone, 4-methyl-2-pentanone; aromatic hydrocarbons and halogenated hydrocarbons, such as toluene, xylene, dichloroethane, tetrachloroethane, 1,1,1-trichloroethane; and acetates such as butyl acetate and mixtures of the above.

The ranges of the relative amounts of each ingredient in the formulation are not critical and are chosen from a practical standpoint to provide suitable coatings for a particular application. In general, suitable formulations are as follows, wherein parts are parts by weight:

0.5 – 10 parts vinyl unsaturated silane monomer
0.5 – 10 parts bifunctional silane adhesion promoter
0.1 – 15 parts polymeric plasticizer
0.0 – 80 parts stabilizer, and
organic solvent to provide 1–50% by weight concentration of the other ingredients.

A preferred range of formulations includes 1–1.6 parts silane monomer, 1–1.6 parts silane adhesion promoter, 1–2 parts polymeric plasticizer, 3–10 parts stabilizer, and 10–20 parts organic solvent.

The coatings are applied to give a cured coating thickness in the range of about 50 microinches to about 3 mils. The thicker (2 to 3 mils) coatings can be employed in certain applications to take full advantage of the dielectric insulating properties of the coatings. When providing coatings for substrates having integrated circuit chips mounted thereon, the wet coating should be less than the height of the bottom surface of the chip from the surface of the substrate. This is necessary to avoid bridging of the coating between the chip and the substrate. If bridging occurs, relative movement between the substrate and the chip due to thermal expansion effects may be inhibited. Thermal expansion effects then can cause cracking of the metal conductor lines. Accordingly, if the chip height is, for example, approximately 4.5 mils from the substrate surface then the wet coating should be less than 4.5 mils or preferably about 3.5 to 4.0 mils of wet coat. The solids content of the coating is adjusted to provide the desired thickness, for example, 400 to 500 microinches, of dry hermetic topsealant coating on the conductor lines.

When coating substrates having integrated circuit chips mounted thereon, the coating is cured by heating in 3 stages. In the first, or low temperature stage, the coating is heated at temperatures of from about 40° to 75° C so as to dry the coating and remove the majority of the solvent from under the semiconductor chips. Otherwise, the vapor pressure of the evaporating solvent may cause separation of the chips and the substrate. In the second stage, the coatings are cured at temperatures of from about 80° to 110° C to polymerize the coating to a solid film without cracking. The final high temperature curing stage of from about 115° to 180° C is employed to provide a coating with optimized hermeticity and dimensional stability. Where a subsequent process step will cause the coating to be heated to a high temperature, then this temperature should be approximated during the third heating stage. The heating times are not particularly critical with the first two stages generally ranging from 1 to 4 hours and a final cure from ½ to 2 hours.

The invention is further illustrated by, but is not intended to be limited to the following examples wherein parts are parts by weight unless otherwise indicated.

EXAMPLE 1

A coating formulation was prepared by mixing the following materials:

| | |
|---|---|
| pentamethyldisiloxane methylmethacrylate | 1.60 grams |
| gamma-aminopropyltriethoxysilane | .25 gram |
| Shell Epon 828 epoxy resin plasticizer (condensation product of epichlorohydrin and bisphenol-A) | .50 gram |
| piperidine stabilizer | 3.40 grams |
| maleic anhydride accelerator | 0.75 gram |
| toluene | 20.00 grams |

Four drops of the formulation were placed on the surface of a metallized ceramic module between semiconductor chips which were mounted to the conductor metallurgy on the module. The solution flowed uniformly over the entire surface of the module including underneath the chips. The module was placed in an oven at 75° C for 2.5 hours to evaporate the solvent. The partially dried coating was placed in another oven at a temperature of 105° C for about 3.5 hours to further dry and to polymerize the coating. The coating was then cured for 1.5 hours at a temperature of 170° C to achieve stability.

The process was repeated with a clear glass module being coated. This allowed pictures to be taken from the backside of the module so that the uniformity of the coating under the chips could be checked. The coating coverage was adequate and uniform.

The metallized ceramic module with the cured hermetic topcoat was placed in a wet sulfur atmosphere at a temperature of 95° C. The line resistance was measured (5 milliohms) and no measurable change was noted after 500 hours. The insulation resistivity between adjacent conductor lines was measured after 500 hours ($1 \times 10^8$ to $1 \times 10^9$ ohms) and it also remained about the same.

EXAMPLE 2

Cured coatings were formed on metallized ceramic modules as in Example 1 using the following coating formulations:

| A. | |
|---|---|
| gamma-methacryloxypropyltrimethoxysilane | 1.60 grams |
| beta-(3,4-epoxycyclohexyl)-ethyltrimethoxysilane | 0.25 gram |
| piperidine | 3.40 grams |
| maleic anhydride | 0.75 gram |
| toluene | 10.00 grams |
| xylene | 10.00 grams |
| styrene | 1.00 grams |

| B. | |
|---|---|
| vinyltrichlorosilane | 1.60 grams |
| beta-(3,4-epoxycyclohexyl)-ethyltrimethoxysilane | 0.25 gram |
| polychloroprene (Neoprene W) | 0.50 gram |
| piperidine | 3.40 grams |
| maleic anlydride | 0.75 grams |
| xylene | 8.00 grams |
| butyl acetate | 2.00 grams |

The coatings were subjected to environmental testing as in Example 1. The insulation resistance was good as it did not change. The corrosion resistance was less than with the paramethyl disiloxane methylmethacrylate monomer used in Example 1 as the line resistance increased somewhat. However, the line resistance still remained below the failure level of 10 milliohms after 500 hours in a wet sulfur atmosphere.

EXAMPLE 3

A metallized ceramic module having a single chip mounted thereon was dispense coated with the following formulation:

| | |
|---|---|
| beta-(3,4-epoxycyclohexyl)-ethyltrimethoxysilane | 1.60 grams |
| pentamethyldisiloxane methylmethacrylate | 1.40 grams |
| epoxy resin (Epon resin 828) | 1.00 gram |
| piperidine | 7.50 grams |
| toluene | 10.00 grams |

The module was placed in an oven at a temperature of 55° C for 1 hour to dry the film to a viscous deposit. The film was further baked at 95° C for 2 hours to achieve a solid polymerized film. By further exposing the film to a temperature of 125° C for 1 hour, the coating's dimensional stability was improved. The resultant cured film provided a uniform, continuous, adherent hermetic sealant coating for the module metallurgy.

EXAMPLE 4

The formulations in Table I were employed to coat modules and provided adequate topsealant layers which were useful in preventing corrosion/migration. Formulation A was brittle but the formulations containing a plasticizer provided ductile coatings.

EXAMPLE 5

Additional suitable formulations are listed in Table II below.

EXAMPLE 6

A mixture was prepared by adding 1.5 grams of paramethyldisiloxane methylmethacrylate to 5.0 grams of toluene. The mixture was used to coat modules and the coating was dried and cured. A solid coating resulted but the coating contained voids and had inadequate adhesion.

EXAMPLE 7

A mixture was prepared by mixing 1.5 grams of pentamethyl disiloxane methylmethacrylate and 2.5 grams of piperidine with 5.0 grams of toluene. The formulation yielded a wet film which upon heat or UV exposure was transformed into a solid coating. The coating had poor adhesion and was very brittle.

The topsealant coatings of the invention are resistant to extremes of temperature and provide hermetic protection for joints and conductor metallurgy against metal corrosion/migration. The coatings fill in voids in the surface and adequately coat surfaces under semiconductor chips and enhance the bonds between the chips and substrate. The coatings are dielectric insulators and are compatible with backsealants. They are inexpensive and easily applied and protect the circuitry from environmental effects during storage and use.

TABLE I

| | Formulation in Grams | | | | | |
|---|---|---|---|---|---|---|
| Materials | A | B | C | D | E | F |
| pentamethyldisiloxane methyl methacrylate | 1.5 | 1.5 | 1.5 | 1.5 | 1.5 | 1.5 |
| beta-(3,4-epoxycyclohexyl) ethyltrimethoxysilane | 1.0 | 1.0 | 1.0 | 1.0 | 1.0 | 1.0 |
| epoxy resin (Epon 828) | — | 1.3 | — | — | — | — |
| styrene | — | — | 1.3 | 1.3 | — | — |
| polychloroprene (Neoprene W) | — | — | — | — | 1.3 | — |
| polyamide/polyimide | — | — | — | — | — | 1.3 |
| piperidine | 2.5 | 2.5 | 2.5 | 2.5 | 2.5 | 2.5 |
| toluene | 5.0 | 5.0 | 5.0 | — | — | — |
| cyclohexanone | — | — | — | 5.0 | 5.0 | — |
| dimethyl acetamide | — | — | — | — | — | 15.0 |

TABLE II

| | Formulation in Grams | | | |
|---|---|---|---|---|
| Materials | A | B | C | D |
| pentamethyldisiloxane methyl methacrylate | 1.6 | 1.6 | 1.4 | 1.6 |
| beta-(3,4-epoxycyclohexyl) ethyltrimethoxysilane | 0.25 | 0.25 | 1.6 | 0.25 |
| epoxy resin | 0.5 | — | 1.0 | — |
| polyimide/amide | — | 1.0 | — | — |
| polychloroprene(Neoprene W) | — | — | — | 1.0 |
| piperidine | 3.4 | 3.4 | 7.5 | 3.4 |
| maleic anhydride | 0.75 | — | 0.75 | 0.75 |
| cinnamaldehyde | — | 0.75 | — | — |
| xylene | 10.0 | — | 10.0 | 10.0 |
| toluene | 10.0 | — | 10.0 | 10.0 |
| dimethyl acetamide | — | 15.0 | — | — |

We claim:

1. A process for forming a hermetic seal coating on electronic circuitry comprising applying to said circuitry a mixture which includes:
   a. a vinyl unsaturated silane monomer
   b. a bifunctional silane adhesion promoter
   c. a polymeric plasticizer, and
   d. an organic solvent
and curing said mixture to form a solid, adherent, crosslinked polysilane coating on said circuitry.

2. The process of claim 1 wherein the mixture includes by weight 0.5 to 10 parts of monomer, 0.5 to 10 parts of adhesion promoter, 1 to 15 parts of polymeric plasticizer and sufficient organic solvent to provide a mixture which contains 1 to 50% by weight concentration of the other ingredients.

3. A composition for forming a hermetic seal coating on electronic circuitry comprising a mixture which includes:
   a. a vinyl unsaturated silane monomer
   b. a bifunctional silane adhesion promoter
   c. a polymeric plasticizer, and
   d. an organic solvent.

4. The composition of claim 3 wherein the mixture includes by weight 0.5 to 10 parts of monomer, 0.5 to 10 parts of adhesion promoter, 0.1 to 15 parts of plasticizer, and sufficient organic solvent to provide a mixture which contains 1 to 50% by weight concentration of the other ingredients.

5. The composition of claim 4 wherein said mixture includes a stabilizer.

6. The composition of claim 5 in which the mixture includes by weight: 0 to 80 parts of stabilizer.

7. A process for forming a hermetic seal coating over electronic circuitry, which is supported on the surface of a substrate, comprising applying to said surface and circuitry a mixture which includes:
   a. 0.5 to 10 parts by weight of a vinyl unsaturated silane monomer selected from the group consisting of, pentamethyldisiloxane methylmethacrylate, vinyltrichlorosilane, vinyltriethoxysilane and vinyltris(2-methoxyethoxy)silane;
   b. 0.5 to 10 parts by weight of a bifunctional silane adhesion promoter selected from the group consisting of, gamma-aminopropyltriethoxysilane, beta- (3,4-epoxycyclohexyl)-ethyltrimethoxysilane, gamma-glycidoxypropyltrimethoxysilane, and N-beta(aminoethyl)-gamma-aminopropyl-trimethoxysilane;

c. 0.1–15 parts by weight of a polymeric plasticizer selected from the group consisting of, epoxy resins, polyesters, polycarbonates, polychloroprene, polystyrene, alkyd resins, allyl resins, amino resins, polysulfone resins, vinyl polymers and copolymers, urea and melamine resins and amide/imide polymers, d. 0.0–80 parts by weight of a stabilizer selected from the group consisting of dimethylacetamide, N N-dimethylaniline, piperidine, 4',4'-dimethoxydiphenylamine, and phenyl-alpha-naphthylamine, and e. an organic solvent in an amount to provide 1–50% by weight concentration of the other ingredients, and curing said mixture to form a solid, adherent, cross-linked polysilane coating having a thickness of from about 50 microinches to about 3 mils on said surface and circuitry.

8. The process of claim 7 wherein the monomer is pentamethyldisiloxane methylmethacrylate and the adhesion promoter is beta-(3,4-epoxycyclohexyl)-ethyltrimethoxysilane.

9. The process of claim 7 wherein the monomer is pentamethyldisiloxane and the adhesion promoter is gamma-aminopropyltriethoxysilane.

10. The process of claim 7 wherein the curing is achieved by a three step heating cycle in which the mixture is first dried to a viscous state by heating at temperatures of from about 40° to 75° C, is next polymerized to a solid film by heating at temperatures of from about 80° to 110° C and is finally cured to a dimensionally stable state by heating at temperatures of from about 115° to 180° C.

11. A composition for forming a hermetic seal coating on electronic circuitry comprising a mixture which includes:

a. 0.5 to 10 parts by weight of, a vinyl unsaturated silane monomer selected from the group consisting of, pentamethyldisiloxane methylmethacrylate, vinyltrichlorosilane, vinyltriethoxysilane and vinyltris(2-methoxyethoxy)silane;

b. 0.5 to 10 parts by weight of a bifunctional silane adhesion promoter selected from the group consisting of, gamma-aminopropyltriethoxysilane, beta-(3,4-epoxycyclohexyl)-ethyltrimethoxysilane, gamma-glycidoxypropyltrimethoxysilane, and N-beta(aminoethyl)-gamma-aminopropyl-trimethoxysilane;

c. 0.1–15 parts by weight of a polymeric plasticizer selected from the group consisting of, epoxy resins, polyesters, polycarbonates, polychloroprene, polystyrene, alkyd resins, allyl resins, amino resins, polysulfone resins, vinyl polymers and copolymers, urea and melamine resins and amide/imide polymers, d. 0.0–80 parts by weight of a stabilizer selected from the group consisting of dimethylacetamide, N N-dimethylaniline, piperidine, 4',4'-dimethoxydiphenylamine, and phenyl-alpha-naphthylamine, and e. an organic solvent in an amount to provide 1–50% by weight concentration of the other ingredients.

12. A process for forming a hermetic seal coating on metal conductor lines on the surface of a substrate having integrated circuit chips electrically bonded thereto comprising:

applying to said surface a coating material comprises:

a. 0.5 to 10 parts by weight of, a vinyl unsaturated silane monomer selected from the group consisting of, pentamethyldisiloxane methylmethacrylate, vinyltrichlorosilane, vinyltriethoxysilane and vinyltris(2-methoxyethoxy)silane;

b. 0.5 to 10 parts by weight of a bifunctional silane adhesion promoter selected from the group consisting of, gamma-aminopropyltriethoxysilane, beta-(3,4-epoxycyclohexyl)-ethyltrimethoxysilane, gamma-glycidoxypropyltrimethoxysilane, and N-beta(aminoethyl)-gamma-aminopropyl-trimethoxysilane;

c. 0.1–15parts by weight of a polymeric plasticizer selected from the group consisting of, epoxy resins, polyesters, polycarbonates, polychloroprene, polystyrene, alkyd resins, allyl resins, amino resins, polysulfone resins, vinyl polymers and copolymers, urea and melamine resins and amide/imide polymers, d. 0.0–80 parts by weight of a stabilizer selected from the group consisting of dimethylacetamide, N N-dimethylaniline, piperidine, 4',4'-dimethoxydiphenylamine, and phenyl-alpha-naphthylamine, and e. an organic solvent in an amount to provide 1–50% by weight concentration of the other ingredients, said coating material being applied to a wet thickness less than the distance between the substrate surface and the bottom surface of the chip with the solid content of said coating material being adjusted to provide a dry coating thickness on said conductor lines of 400 to 500 microinches, and curing said coating material by a three step heating cycle in which the mixture is first dried to a viscous state by heating at temperatures of from about 40° to 75° C, is next polymerized to a solid film by by heating at temperatures of from about 80° to 110° C and is finally cured to a dimensionally stable state by heating at temperatures of from about 115° to 180° C.

13. The process of claim 12 wherein the coating material consists essentially of:

1–1.6 parts by weight said silane monomer,

1–1.6 parts by weight of said silane adhesion promoter,

1–2 parts by weight of said polymeric plasticizer,

3–10 parts by weight of said stabilizer, and

10–20 parts by weight of said organic solvent.

* * * * *